(12) United States Patent
Kanarik et al.

(10) Patent No.: US 9,576,811 B2
(45) Date of Patent: Feb. 21, 2017

(54) INTEGRATING ATOMIC SCALE PROCESSES: ALD (ATOMIC LAYER DEPOSITION) AND ALE (ATOMIC LAYER ETCH)

(71) Applicant: Lam Research Corporation, Fremont, CA (US)

(72) Inventors: Keren Jacobs Kanarik, Los Altos, CA (US); Jeffrey Marks, Saratoga, CA (US); Harmeet Singh, Fremont, CA (US); Samantha Tan, Fremont, CA (US); Alexander Kabansky, Santa Clara, CA (US); Wenbing Yang, Fremont, CA (US); Taeseung Kim, San Jose, CA (US); Dennis M. Hausmann, Lake Oswego, OR (US); Thorsten Lill, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/696,254

(22) Filed: Apr. 24, 2015

(65) Prior Publication Data
US 2016/0203995 A1    Jul. 14, 2016

Related U.S. Application Data

(60) Provisional application No. 62/102,463, filed on Jan. 12, 2015.

(51) Int. Cl.
*H01L 21/3065* (2006.01)
*H01L 21/311* (2006.01)
(Continued)

(52) U.S. Cl.
CPC ..... *H01L 21/30655* (2013.01); *H01L 21/0228* (2013.01); *H01L 21/31116* (2013.01);
(Continued)

(58) Field of Classification Search
CPC ............... H01L 21/30655; H01L 21/67069; H01L 21/6831; H01L 21/31116; H01L 21/0228; H01L 21/3141; H01L 21/28194; C23C 16/44; C23C 16/45525; C23C 16/4554
(Continued)

(56) References Cited

U.S. PATENT DOCUMENTS

| 5,501,893 A | 3/1996 | Laermer et al. |
| 6,448,192 B1 * | 9/2002 | Kaushik ............ H01L 21/28167 |
| | | 257/E21.193 |

(Continued)

FOREIGN PATENT DOCUMENTS

WO    WO 2016/100873    6/2016

OTHER PUBLICATIONS

U.S. Appl. No. 14/325,190, filed Jul. 7, 2014, entitled "Method to Etch Non-Volatile Metal Materials.".

(Continued)

*Primary Examiner* — Caleen Sullivan
(74) *Attorney, Agent, or Firm* — Weaver Austin Villeneuve & Sampson LLP

(57) ABSTRACT

Methods are provided for integrating atomic layer etch and atomic layer deposition by performing both processes in the same chamber or reactor. Methods involve sequentially alternating between atomic layer etch and atomic layer deposition processes to prevent feature degradation during etch, improve selectivity, and encapsulate sensitive layers of a semiconductor substrate.

26 Claims, 7 Drawing Sheets

(51) Int. Cl.
*H01L 21/02* (2006.01)
*H01L 21/67* (2006.01)
*H01L 21/683* (2006.01)

(52) U.S. Cl.
CPC .. *H01L 21/67069* (2013.01); *H01L 21/67207* (2013.01); *H01L 21/6831* (2013.01)

(58) Field of Classification Search
USPC ........................................................ 438/703
See application file for complete search history.

(56) References Cited

U.S. PATENT DOCUMENTS

| 8,808,561 B2 | 8/2014 | Kanarik | |
|---|---|---|---|
| 8,883,028 B2 | 11/2014 | Kanarik | |
| 2002/0081381 A1* | 6/2002 | DelaRosa | C23C 16/18 427/255.28 |
| 2011/0139748 A1* | 6/2011 | Donnelly | H01J 37/32036 216/37 |
| 2013/0168354 A1 | 7/2013 | Kanarik | |
| 2015/0037972 A1 | 2/2015 | Danek et al. | |
| 2015/0214474 A1 | 7/2015 | Nishimura et al. | |

OTHER PUBLICATIONS

U.S. Appl. No. 14/749,285, filed Jun. 24, 2015, entitled " Cobalt Etch Back."

U.S. Appl. No. 14/749,291, filed Jun. 24, 2015, entitled "Dry Plasma Etch Method to Pattern MRAM Stack."

Puurunen, Rikka L. (2005) "Surface chemistry of atomic layer deposition: A case study for the trimethylaluminum/water process," *Journal of Applied Physics*, 97:121301-51 pages.

US Office Action dated May 5, 2016 issued in U.S. Appl. No. 14/749,285.

Lee et al. (2015) "Atomic Layer Etching of $Al_2O_3$ Using Sequential, Self-Limiting Thermal Reactions with $Sn(acac)_2$ and Hydrogen Fluoride," $^{ACS}NANO$,9(2):2061-2070.

Wolf, S. and Tauber, R.N. (1986) "Silicon Processing for the VLSI Era," vol. 1—*Process Technology, Lattice Press*, pp. 542-557.

* cited by examiner

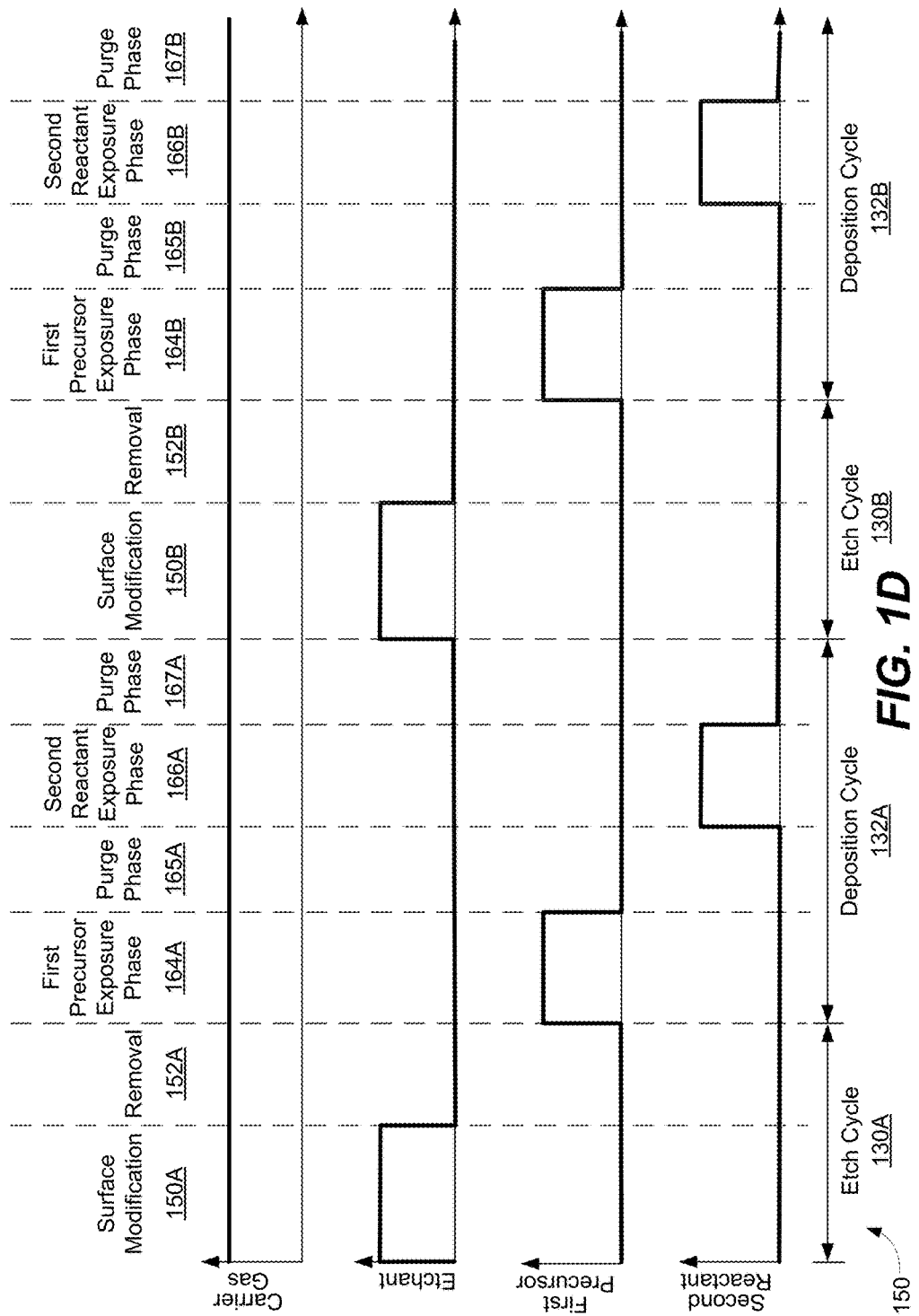

INTEGRATING ATOMIC SCALE PROCESSES: ALD (ATOMIC LAYER DEPOSITION) AND ALE (ATOMIC LAYER ETCH)

CROSS-REFERENCE TO RELATED APPLICATION

This application claims benefit of U.S. Provisional Patent Application No. 62/102,463, filed Jan. 12, 2015, and titled "INTEGRATING ATOMIC SCALE PROCESSES: ALD (ATOMIC LAYER DEPOSITION) AND ALE (ATOMIC LAYER ETCH)," which is incorporated by reference herein in its entirety and for all purposes.

BACKGROUND

As feature sizes shrink, there is a growing need for atomic scale processing such as Atomic Layer Deposition (ALD) and Atomic Layer Etch (ALE). ALD and ALE processes are conventionally performed as separate processes, such that all ALD or all ALE operations are performed before all ALE or all ALD operations, respectively. Conventional ALD and ALE processes use separate reactors or chambers to accommodate conditions, precursor chemistry, and parameters for each corresponding process.

SUMMARY

Provided are methods of integrating atomic layer etch and atomic layer deposition. One aspect involves a method of processing a substrate by etching the substrate by atomic layer etch in a chamber; and depositing a film by atomic layer deposition in the chamber, whereby the etching and the depositing are performed without breaking vacuum.

The etching may be performed in cycles, where a cycle includes: exposing a substrate to an etching gas to modify the surface of the substrate; and exposing the substrate to a removal gas to remove at least some of the modified surface. Exposing the substrate to the etching gas may further include igniting a plasma. In some embodiments, the method further includes applying a bias to the substrate. The etching gas may be a chlorine-containing compound. In various embodiments, a cycle etches between about 1 Å to about 50 Å of film. The chamber may be purged between exposures.

The depositing may be performed in cycles, where a cycle includes: exposing the substrate to a deposition precursor to modify the surface of the substrate; and exposing the substrate to a reducing agent to deposit the film. In some embodiments, the method further includes igniting a plasma. In some embodiments, at least some of the deposition precursor adsorbs onto the surface of the substrate during the exposing of the substrate to the deposition precursor. The chamber may be purged between exposures.

In some embodiments, the etching and the depositing are performed to deposit material on the substrate. In some embodiments, the etching and the depositing are performed to etch material on the substrate.

In various embodiments, the etching further includes directionally sputtering the substrate. In some embodiments, the etching and the depositing is performed in the same chamber. The etching may be performed nonconformally. In some embodiments, at least one of the etching or the depositing is a self-limiting reaction.

Another aspect involves a method including: (a) exposing a substrate housed in a chamber to alternating pulses of an etching gas and a removal gas to etch the substrate layer by layer; (b) exposing the substrate to alternating pulses of a first reactant and a second reactant to deposit a film over the substrate; and (c) repeating (a) and (b) in the same chamber.

The removal gas may be a carrier gas selected from the group consisting of $N_2$, Ar, He, and Ne. In some embodiments, (a) and (b) are performed in the same chamber and are performed sequentially. Furthermore, the chamber may be purged between pulses. In various embodiments, (a) further includes applying a bias to the substrate. In some embodiments, (a) further includes directionally sputtering the substrate.

In some embodiments, the method also includes igniting a plasma when exposing the substrate to the removal gas. The method may also include igniting a plasma when exposing the substrate to the second reactant.

In various embodiments, at least one of (a) or (b) is a self-limiting reaction. In some embodiments, (a) and (b) are repeated to deposit material on the substrate. In some embodiments, (a) and (b) are repeated to etch a film on the substrate. In various embodiments, the substrate is selected from the group consisting of metals and dielectrics.

Another aspect involves an apparatus for processing substrates, the apparatus including: one or more process chambers, each process chamber including a chuck; one or more gas inlets into the process chambers and associated flow-control hardware; and a controller having at least one processor and a memory, whereby the at least one processor and the memory are communicatively connected with one another, the at least one processor is at least operatively connected with the flow-control hardware, and the memory stores computer-executable instructions for controlling the at least one processor to at least control the flow-control hardware by etching the substrate by atomic layer etch in a chamber; and depositing a film by atomic layer deposition in the chamber, whereby etching and depositing are performed without breaking vacuum.

Another aspect involves an apparatus for processing substrates, the apparatus including: one or more process chambers, each process chamber including a chuck; one or more gas inlets into the process chambers and associated flow-control hardware; and a controller having at least one processor and a memory, whereby the at least one processor and the memory are communicatively connected with one another, the at least one processor is at least operatively connected with the flow-control hardware, and the memory stores computer-executable instructions for controlling the at least one processor to at least control the flow-control hardware by: (a) exposing a substrate to alternating pulses of an etchant and purge gas to etch the substrate layer by layer; (b) exposing the substrate to alternating pulses of a reducing agent and a precursor to deposit a film on the etched substrate; and (c) repeating (a) and (b) without breaking vacuum between performing (a) and (b).

These and other aspects are described further below with reference to the drawings.

BRIEF DESCRIPTION OF THE DRAWINGS

FIG. 1D is a timing schematic diagram depicting an example of operations performed in accordance with disclosed embodiments.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

As feature sizes shrink, there is a growing need for atomic scale processing such as Atomic Layer Deposition (ALD) and Atomic Layer Etch (ALE). These are cyclic processes of nominally self-limiting steps that result in digital and small changes in film thicknesses. The processes are characterized by smoothness and conformality, and also directionality in the case of some ALE. The ALD and ALE processes have been conventionally performed independently such that all deposition processes are performed before all etch processes, or vice versa. Conventional ALD and ALE processes are performed on different tools. For example, conventionally ALD tools do not run ALE processes, and ALE tools do not run ALD processes.

Provided herein are methods for integrating etching and deposition processes in situ (e.g., in the same chamber of a tool or without breaking vacuum). The disclosed embodiments may be used for net-depositing material or net-etching material on a substrate. Some methods described herein involve depositing a passivation layer by ALD during ALE processes. Disclosed methods are suitable for a wide range of applications, including etching processes for trenches and holes, fabrication of MRAM, fabrication of phase change materials, improved selectivity in etching processes, and poly dummy removal. For example, deposition during etch may be used to protect sidewalls or a mask during etch or encapsulate a material during etch and with subsequent exposure to atmosphere, or provide selectivity if the deposition is selective; and etching during deposition may be used to keep features open during deposition.

Figure 1A:
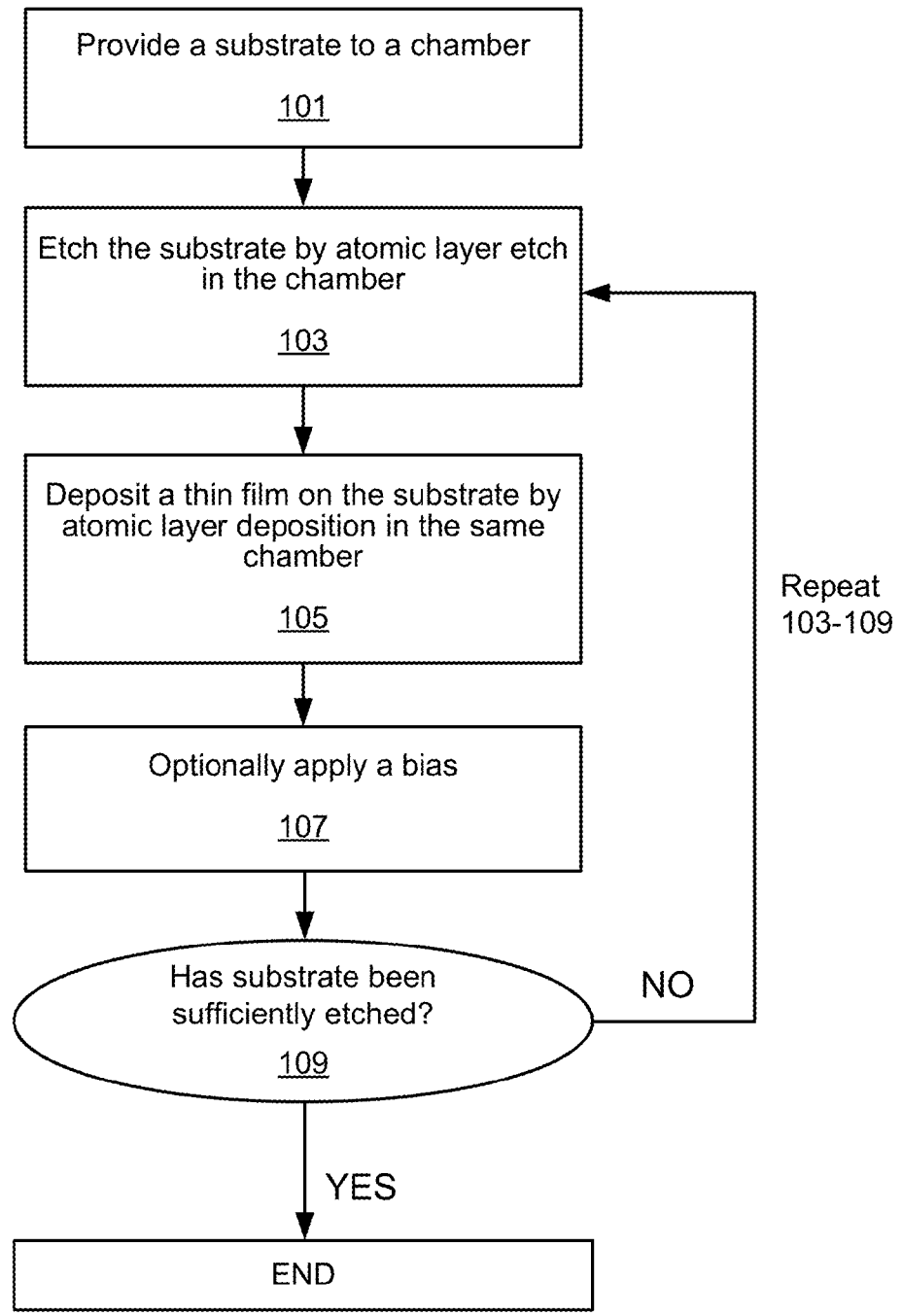
FIG. 1A is a process flow diagram depicting operations for a method in accordance with disclosed embodiments.

FIG. 1A provides a process flow diagram for performing operations in a method in accordance with disclosed embodiments. Operations in FIG. 1A may be performed at a chamber pressure between about 1 mTorr and about 100 Torr, e.g., about 1 mTorr and about 1 Torr. In operation 101, a substrate or wafer is provided to a processing chamber. The chamber may be a chamber in a multi-chamber apparatus or a single-chamber apparatus. The substrate may be a silicon wafer, e.g., a 200-mm wafer, a 300-mm wafer, or a 450-mm wafer, including wafers having one or more layers of material, such as dielectric, conducting, or semi-conducting material deposited thereon. In some embodiments, the substrate includes a blanket layer of silicon, such as amorphous silicon, or a blanket layer of germanium. The substrate may include a patterned mask layer previously deposited and patterned on the substrate. For example, a mask layer may be deposited and patterned on a substrate including a blanket amorphous silicon layer.

In some embodiments, the layers on the substrate may be patterned. Substrates may have "features" such as via or contact holes, which may be characterized by one or more of narrow and/or re-entrant openings, constrictions within the feature, and high aspect ratios. The feature may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the features may have aspect ratios of at least about 2:1, at least about 4:1, at least about 6:1, at least about 10:1, at least about 30:1, or higher. Protection of feature sidewalls may be desirable at high aspect ratios. Disclosed methods may be performed on substrates with features having an opening less than about 150 nm. A feature via or trench may be referred to as an unfilled feature or a feature. A feature that may have a re-entrant profile that narrows from the bottom, closed end, or interior of the feature to the feature opening. In some embodiments, the methods described herein may be used to form features having these characteristics.

Returning to FIG. 1A, in operation 103, the substrate is etched by ALE in the chamber. ALE is a technique that removes thin layers of material using sequential self-limiting reactions. Generally, ALE may be performed using any suitable technique. Examples of atomic layer etch techniques are described in U.S. Pat. No. 8,883,028, issued on Nov. 11, 2014; and U.S. Pat. No. 8,808,561, issued on Aug. 19, 2014, which are herein incorporated by reference for purposes of describing example atomic layer etch and etching techniques. In various embodiments, ALE may be performed with plasma, or may be performed thermally.

Figure 1B:
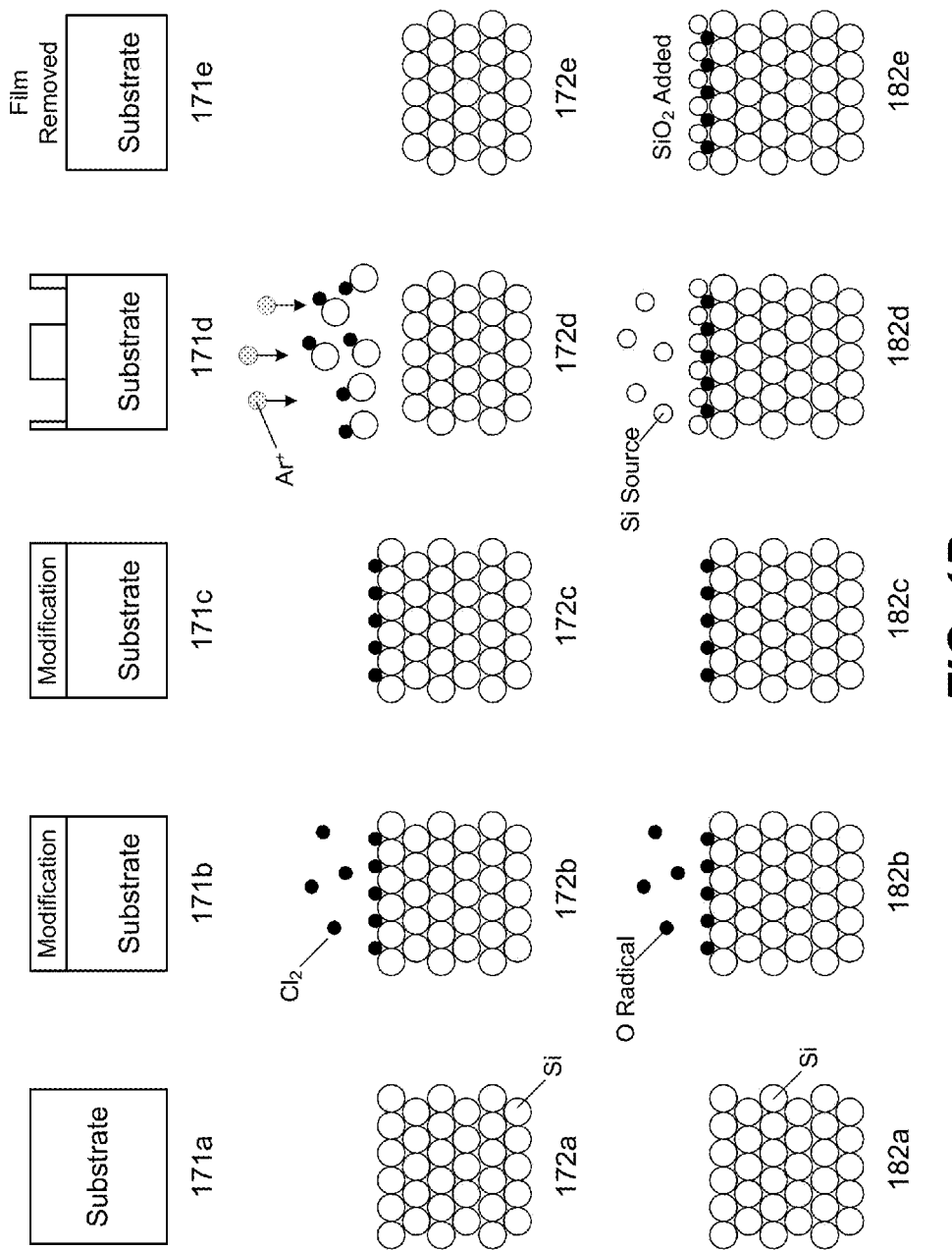
FIG. 1B is a schematic illustration of examples of etch and deposition.

Operation 103 may be performed in cycles. The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas, (ii) purging of the reactant gas from the chamber, (iii) delivery of a removal gas and an optional plasma, and (iv) purging of the chamber. In some embodiments, etching may be performed nonconformally. FIG. 1B shows two example schematic illustrations of an ALE cycle. Diagrams 171a-171e show a generic ALE cycle. In 171a, the substrate is provided. In 171b, the surface of the substrate is modified. In 171c, the next step is prepared. In 171d, the modified layer is being etched. In 171e, the modified layer is removed. Similarly, diagrams 172a-172e show an example of an ALE cycle for etching a silicon film. In 172a, a silicon substrate is provided, which includes many silicon atoms. In 172b, reactant gas chlorine is introduced to the substrate which modifies the surface of the substrate. The schematic in 172b shows that some chlorine is adsorbed onto the surface of the substrate as an example. Although chlorine is depicted in FIG. 1B, any chlorine-containing compound or suitable reactant may be used. In 172c, the reactant gas chlorine is purged from the chamber. In 172d, a removal gas argon is introduced with a directional plasma as indicated by the Ar+ plasma species and arrows, and ion bombardment is performed to remove the modified surface of the substrate. During this operation, a bias is applied to the substrate to attract ions toward it. In 172e, the chamber is purged and the byproducts are removed.

A cycle may only partially etch about 0.1 nm to about 50 nm of material, or between about 0.1 nm and about 5 nm of material, or between about 0.2 nm and about 50 nm of material, or between about 0.2 nm and about 5 nm of material. The amount of material etched in a cycle may depend on the purpose of integrating with ALD. For example, if ALD is integrated to protect the sidewalls, then the amount etched in ALE cycles may be varied such that performing ALD protects the exposed sidewalls at the bottom of the feature. In some embodiments, a cycle of ALE may remove less than a monolayer of material.

Etching chemistry is introduced into the chamber in operation 103 of FIG. 1A. As described herein, in operations where materials are introduced into the chamber, in some embodiments involving atomic layer etch using a plasma, the reactor or chamber may be stabilized by introducing the chemistry into the chamber prior to processing the substrate or wafer. Stabilizing the chamber may use the same flow rates, pressure, temperatures, and other conditions as the chemistry to be used in the operation following the stabilization. In some embodiments, stabilizing the chamber may involve different parameters. In some embodiments, a carrier gas, such as $N_2$, Ar, Ne, He, and combinations thereof, is continuously flowed during operation 103. In some embodiments, a carrier gas is only used during removal. The carrier gas may be used as a purge gas in some operations as described below. In some embodiments, another reactant gas, such as oxygen, is used during operation 103 to remove a modified layer. In some embodiments, a carrier gas is not flowed during removal.

Provided herein is an example of modification and removal operations that may be performed in operation 103. The modification operation forms a thin, reactive surface layer with a thickness that is more easily removed than the un-modified material in the subsequent removal operation. In a modification operation, a substrate may be chlorinated by introducing chlorine into the chamber. Chlorine is used as an example etchant species in disclosed embodiments, but it will be understood that in some embodiments, a different etching gas is introduced into the chamber. The etching gas may be selected depending on the type and chemistry of the substrate to be etched. In some embodiments, a plasma may be ignited and chlorine reacts with the substrate for the etching process. In some embodiments, chlorine may react with the substrate or may be adsorbed onto the surface of the substrate. In various embodiments, chlorine is introduced into the chamber in a gaseous form and may be optionally accompanied by a carrier gas which may be any of those described above. The species generated from a chlorine plasma can be generated directly by forming a plasma in the process chamber housing the substrate or they can be generated remotely in a process chamber that does not house the substrate, and can be supplied into the process chamber housing the substrate. In some embodiments, a plasma is not used and chlorine may be introduced thermally into the chamber.

In various embodiments, the plasma may be an inductively coupled plasma or a capacitively coupled plasma. An inductively coupled plasma may be set at a plasma between about 50 W and about 2000 W. In some embodiments, a bias may be applied between about 0V and about 500V.

In some embodiments, a purge may be performed after a modification operation. In a purge operation, non-surface-bound active chlorine species may be removed from the process chamber. This can be done by purging and/or evacuating the process chamber to remove the active species, without removing the adsorbed layer. The species generated in a chlorine plasma can be removed by simply stopping the plasma and allowing the remaining species decay, optionally combined with purging and/or evacuation of the chamber. Purging can be done using any inert gas such as $N_2$, Ar, Ne, He and their combinations.

In a removal operation, the substrate may be exposed to an energy source (e.g. activating or sputtering gas or chemically reactive species that induces removal), such as argon or helium, to etch the substrate by directional sputtering. In some embodiments, the removal operation may be performed by ion bombardment. During removal, a bias may be optionally turned on to facilitate directional sputtering. In some embodiments, ALE may be isotropic.

The amount of sputtering gas may be controlled such as to etch only a targeted amount of material. In various embodiments, the pressure of the chamber may vary between the modification and removal operations. The pressure of the gas may depend on the size of the chamber, the flow rate of the gas, the temperature of the reactor, the type of substrate, and the size of substrate to be etched. If the bias is turned on during removal, the bias may be set at about 50 eV for etching features, trenches, or holes in a soft material such as amorphous silicon. In some embodiments, the chamber may be purged after a removal operation. Purge processes may be any of those used for a purge after a modification operation.

In various embodiments, the modification and removal operations may be repeated in cycles, such as about 1 to about 30 cycles, or about 1 to about 20 cycles. Any suitable number of ALE cycles may be included to etch a desired amount of film. In some embodiments, ALE is performed in cycles to etch about 1 Å to about 50 Å of the surface of the layers on the substrate. In some embodiments, cycles of ALE etch between about 2 Å and about 50 Å of the surface of the layers on the substrate.

Returning to FIG. 1A, in operation 105, a thin film is deposited on the substrate by ALD in the same chamber where the substrate was etched in operation 103 or without breaking vacuum from operation 103. Operations 103 and 105 may be performed in situ, or in a vacuum, without an air break or without breaking vacuum. In various embodiments, a silicon-containing film is deposited in operation 105. Example silicon-containing films include silicon oxide and silicon oxynitride and silicon nitride. In some embodiments, a metal or metal-containing film may be deposited. In some embodiments operation 105 may be performed prior to operation 103. In some embodiments operation 103 may be performed prior to operation 105.

ALD is a technique that deposits thin layers of material using sequential self-limiting reactions. ALD may be performed using any suitable technique. In various embodiments, ALD may be performed with plasma, or may be performed thermally. Operation 105 may be performed in cycles.

The concept of an "ALD cycle" is relevant to the discussion of various embodiments herein. Generally an ALD cycle is the minimum set of operations used to perform a surface deposition reaction one time. The result of one cycle is production of at least a partial silicon-containing film layer on a substrate surface. Typically, an ALD cycle includes operations to deliver and adsorb at least one reactant to the substrate surface, and then react the adsorbed reactant with one or more reactants to form the partial layer of film. The cycle may include certain ancillary operations such as sweeping one of the reactants or byproducts and/or treating the partial film as deposited. Generally, a cycle contains one instance of a unique sequence of operations. As an example, an ALD cycle may include the following operations: (i) delivery/adsorption of a silicon-containing precursor, (ii) purging of silicon-containing precursor from the chamber, (iii) delivery of a second reactant and a plasma, and (iv) purging of plasma from the chamber.

FIG. 1B shows an example schematic illustration of an ALD cycle for depositing silicon oxide ($SiO_2$). Diagrams 182a-182e show a generic ALD cycle. In 182a, a silicon substrate is provided, which includes many silicon atoms. In 182b, oxygen is introduced to the substrate as oxygen radicals, which modify the surface of the substrate. This may be the delivery of the reactant and plasma. Note some oxygen radicals are adsorbed onto the surface of the substrate as an example. In 182c, the oxygen radicals are purged from the chamber. In 182d, a silicon-containing precursor or silicon source is introduced and the silicon source reacts with the oxygen radicals adsorbed on the surface of the substrate. In 182e, the chamber is purged and the byproducts are removed, leaving behind a deposited layer of $SiO_2$.

In some embodiments, the films deposited by ALD may be highly conformal. Conformality of films may be measured by the step coverage. Step coverage may be calculated by comparing the average thickness of a deposited film on a bottom, sidewall, or top of a feature to the average thickness of a deposited film on a bottom, sidewall, or top of a feature. For example, step coverage may be calculated by dividing the average thickness of the deposited film on the sidewall by the average thickness of the deposited film at the top of the feature and multiplying it by 100 to obtain a percentage.

Unlike a chemical vapor deposition (CVD) technique, ALD processes use surface-mediated deposition reactions to deposit films on a layer-by-layer basis. In one example of an ALD process, a substrate surface, including a population of surface active sites, is exposed to a gas phase distribution of a first precursor, such as a silicon-containing precursor, in a dose provided to a process chamber housing the substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. In certain embodiments, an ALD precursor dose partially saturates the substrate surface. In some embodiments, the dose phase of an ALD cycle concludes before precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587, filed Oct. 23, 2013, titled "SUB-SATURATED ATOMIC LAYER DEPOSITION AND CONFORMAL FILM DEPOSITION," which is incorporated herein by reference in its entirety. After a first precursor dose, the reactor is then evacuated to remove any first precursor remaining in gas phase so that only the adsorbed species remain. A second reactant, such as an oxygen or nitrogen-containing gas, is introduced to the reactor so that some of these molecules react with the first precursor adsorbed on the surface. In some processes, the second precursor reacts immediately with the adsorbed first precursor. In other embodiments, the second precursor reacts only after a source of activation is applied temporally. The reactor may then be evacuated again to remove unbound second precursor molecules. Additional ALD cycles may be used to build film thickness.

In some implementations, the ALD methods include plasma activation, such as when the second reactant is delivered to a chamber. As described herein, the ALD method and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in its entireties. Additional examples of ALD processes are described in Puurunen, "Surface chemistry of atomic layer deposition: for the trimethylaluminum/water process", 97 J. Applied Physics 12301 (2005), which is herein incorporated by reference for the purpose of providing description for suitable ALD processes.

Returning to FIG. 1A, in operation 105, in some embodiments, a carrier gas, such as $N_2$, Ar, Ne, He, and combinations thereof, may be continuously flowed. The carrier gas may be used as a purge gas. The inert gas may be provided to assist with pressure and/or temperature control of the process chamber, evaporation of a liquid reactant, more rapid delivery of the reactant and/or as a sweep gas for removing process gases from the process chamber and/or process chamber plumbing.

Provided herein is an example of adsorption and second reactant delivery operations that may be performed in operation 105. In an adsorption operation of an ALD cycle, the substrate may be exposed to a film precursor, such as silicon tetrachloride ($SiCl_4$), to adsorb onto the substrate surface. In some embodiments, the film precursor may be a silicon-containing precursor. In some embodiments, the film precursor, such as $SiCl_4$, may be adsorbed onto about 60% of the substrate surface. In various embodiments, when the film precursor is flowed to the chamber, the film precursor adsorbs onto active sites on the surface of the substrate, forming a thin layer of the film precursor on the surface. In various embodiments, this layer may be less than a monolayer.

After adsorption, the chamber may be optionally purged to remove excess precursor in gas phase that did not adsorb onto the surface of the substrate. Purging may involve a sweep gas, which may be a carrier gas used in other operations or a different gas. In some embodiments, purging may involve evacuating the chamber.

In a second reactant delivery operation of an ALD cycle, the substrate may be exposed to a second reactant and, optionally, a plasma. In various embodiments, the second reactant is oxygen ($O_2$) or nitrogen ($N_2$) or combinations thereof. In some embodiments where a silicon oxide layer is deposited, oxygen is used as the second reactant. In some embodiments, second reactant flow and the plasma are both turned on. In some embodiments, second reactant flow may be turned on prior to turning on the plasma to, for example, allow the second reactant flow to stabilize.

In some embodiments, the optional plasma is an in-situ plasma, such that the plasma is formed directly above the substrate surface in the chamber. In various embodiments, the plasma may be an inductively coupled plasma or a capacitively coupled plasma. A inductively coupled plasma may be set at a plasma between about 50 W and about 2000 W. In some embodiments, a bias may be applied between about 0V and about 500V. During delivery of the second reactant, the film precursor, such as $SiCl_4$, is turned off. The substrate may be exposed to the second reactant and the optional plasma for a duration that exceeds a time for plasma to interact with all precursors adsorbed on the substrate surface, forming a continuous film atop the substrate surface.

After the second reactant delivery operation, the chamber may be purged, such as by introducing a carrier or inert gas. Conditions for this operation may be any of those described above for purge processes.

In various embodiments, ALD cycles may be repeated. For example, operations for ALD may be performed for about 5 to about 70 cycles. Any suitable number of deposition cycles may be included to deposit a desired film thickness of the deposited film. In some embodiments, an ALD cycle may deposit about 1 Å per cycle. Depending on the exposure time of the operations, each cycle may deposit a film, such as a silicon oxide or silicon oxynitride film, having a thickness between about 0.05 Å and about 5 Å. In some embodiments, about two to about three cycles of ALD may be performed per minute. In some embodiments, more than about three cycles may be performed per minute, such as in chambers with inlets positioned to be closer to the substrate.

In some embodiments, ALD operations produce conformal films capable of protecting the features from lateral etching in subsequent ALE processes, which may occur in the same chamber. In some embodiments, ALD is integrated to selectively deposit films on a substrate, such as to deposit films on corners of a feature to protect them from erosion during etching processes. In some embodiments, at least one of operation 103 and 105 is self-limiting reaction. In some embodiments, at least one of operation 103 and 105 is as self-limiting reaction as possible. For example, in some embodiments, only operation 103 is a self-limiting process. In some embodiments, only operation 105 is a self-limiting process. In some embodiments, both operations 103 and 105 are self-limiting. In various embodiments, operations 103 and 105 may be performed sequentially. Examples of sequentially performing these operations are further described below with respect to FIGS. 1C and 1D.

In operation 107, a bias is optionally applied. Applying a bias may etch sidewalls, so in various embodiments, a bias may not applied continuously and may be applied after various cycles of ALD and ALE. This operation may be performed to break through the film deposited by ALD. In some embodiments, the bias is set to about 80 eV to break through the layer deposited by cycles of ALD.

In operation 109, it is determined whether sufficient etching has been performed. If the profile is not sufficiently etched, operations 103-109 may be repeated. In some embodiments operations 103-109 are performed in the same chamber or without breaking vacuum for the repeated cycles as in the initial cycle.

Figure 1C:
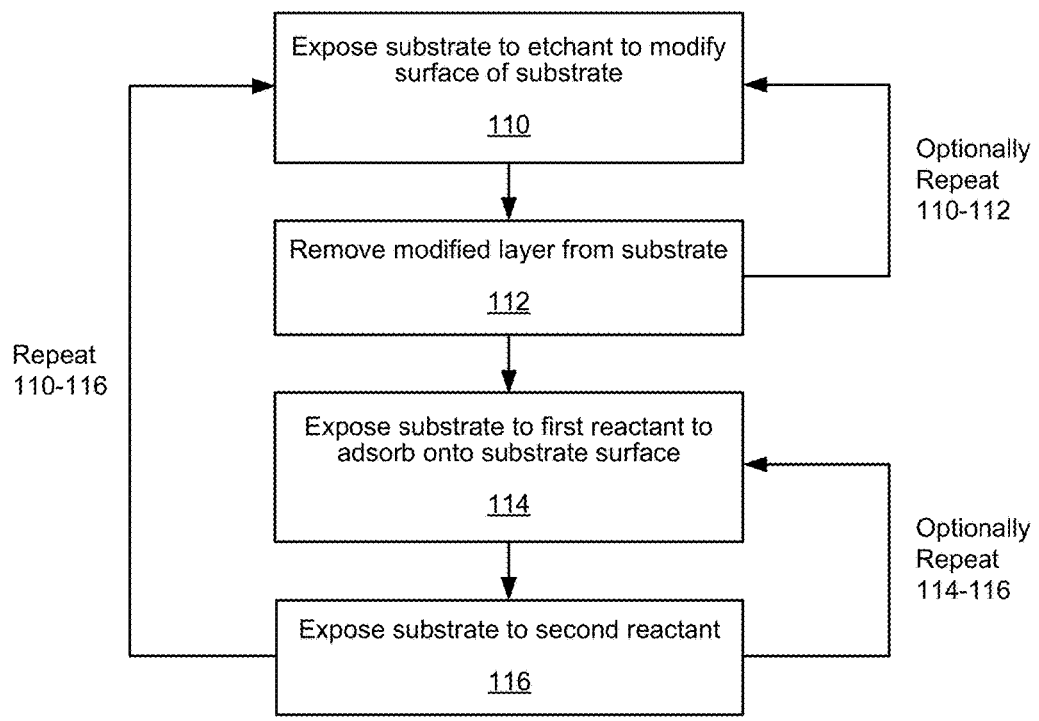
FIG. 1C is a process flow diagram depicting operations for a method in accordance with disclosed embodiments.

FIGS. 1C and 1D provide further examples of disclosed embodiments. In operation 110, a substrate housed in a chamber may be exposed to an etchant or etching gas to modify the surface of the substrate. This may be referred to as a "surface modification" operation. In some embodiments, this may correspond to the surface modification phase 150A shown in FIG. 1D and may be part of an etch cycle. As shown in FIG. 1D, during this operation, a carrier gas may be optionally flowed, while an etchant is flowed to the chamber. A carrier gas may be any of the carrier gases described above with respect to FIG. 1A. In some embodiments, a carrier gas is not flowed during surface modification. The etchant may be flowed such that it modifies only the top surface of the substrate. In various embodiments, a bias may be applied during operation 110. The bias may be applied at a power between about 0V and about 500V.

Returning to FIG. 1C, in operation 112, the modified layer of the substrate may be removed from the substrate by exposing the substrate to a sputtering gas in a removal operation, which may be the same as or different from a carrier gas. In various embodiments, at least part of the substrate surface may be etched in this operation. The example provided above with respect to operation 103 may be used in accordance with these operations. Performing operations 110 and 112 may, in some embodiments, constitute performing atomic layer etch once. In some embodiments, operations 110 and 112 may be optionally repeated one or more times (e.g., in one or more cycles).

Operation 112 may correspond to the removal phase 152A as shown in FIG. 1D. Performing the surface modification 150A and removal 152A may constitute an etch cycle 130A. In some embodiments, a cycle may include more operations. During removal, a carrier gas may be flowed without flowing any other chemistry. The carrier gas may be flowed to help facilitate purging of the modified layer as it is etched. The example provided in FIG. 1D is an example of performing operation 110 of FIG. 1C and operation 112 one time without repeating operations 110 and 112.

In operation 114, the substrate is exposed to a first reactant to adsorb the first reactant onto at least some of the substrate surface. This operation may be performed without breaking vacuum from performing operations 110 and 112. In some embodiments, the first reactant is a film precursor as described herein. In various embodiments, the first reactant may adsorb onto active sites of the substrate. The above described examples of adsorption during an ALD cycle are relevant to this operation.

Operation 114 may correspond to first precursor exposure phase 164A of FIG. 1D. During this operation, the first precursor may be flowed with an optional carrier gas. Note that during this operation, the etchant flow and second reactant flow to be described further below may not be flowed. This operation may be performed for a duration sufficient to saturate at least part of the surface of the substrate. In some embodiments, at least about 40%, or at least about 60%, or at least about 80%, or about 100% of the surface may be saturated.

In some embodiments, after performing the first precursor exposure phase 164A, the chamber housing the substrate may be optionally purged in purge phase 165A in FIG. 1D. During the purge phase 165A, a carrier gas is flowed to remove excess first precursor that did not adsorb onto the surface of the substrate. In some embodiments, the purge phase is not performed.

Returning to FIG. 1C, operation 116 may be performed such that the substrate is exposed to a second reactant. In various embodiments, the second reactant may be a reducing agent. The second reactant reacts with the adsorbed layer to deposit a thin film on the substrate. Note that in some embodiments, operations 114 and 116 may be performed in reverse such that operation 116 is performed prior to adsorbing the first reactant onto the surface of the substrate. Operation 116 may correspond to second reactant exposure phase 166A as shown in FIG. 1D. During this phase, the second reactant is flowed, and a carrier gas is optionally flowed. In some embodiments, a second reactant is flowed without a carrier gas. The etchant and first precursor flow are not turned on during this phase. In various embodiments, the second reactant exposure phase may also include igniting a plasma (not shown). In some embodiments the thin layer of film may be deposited without use of a plasma. In some embodiments, the chamber is optionally purged after the second reactant exposure phase 166A during purge phase 167A. The purge phase 167A may be performed to remove byproducts or excess second reactant in gas phase from the chamber. In some embodiments, the chamber is not purged.

Operations 114 and 116 of FIG. 1C may be optionally repeated one or more times. Performing operations 114 and 116 may constitute an ALD cycle as described above with respect to FIG. 1A. In various embodiments, operations 110-116 are repeated one or more times. A combination of repeated cycles of operations 110 and 112, and repeated cycles of operations 114 and 116 may be performed in further cycles. For example, in some embodiments, a cycle including performing operations 110-112 twice, and performing operations 114-116 three times, may be repeated two or more times. In some embodiments, cycles of operations 110-112 and operations 114-116 are performed sequentially. For example, after performing operations 110-112, operations 114-116 are performed, and/or vice versa. The frequency of cycles and the number of cycles used in a process may depend on the type of application disclosed embodiments are used for.

In FIG. 1D, each cycle is repeated once. As such, etch cycle 130A constitutes repeating operations 110-112 of FIG. 1C once, deposition cycle 132A constitutes repeating operations 114-116 of FIG. 1C once, and both cycles are then repeated once more in etch cycle 130B and deposition cycle 132B. Etch cycle 130B includes a surface modification phase 150B and a removal phase 152B, while deposition cycle 132B includes a first precursor exposure phase 164B, purge phase 165B, second reactant exposure phase 166B, and purge phase 167B. Note that in some embodiments, further repeated cycles may or may not include purge phases 165B and 167B. In some embodiments, durations of exposures and purge phases may vary from cycle to cycle during an integrated process. In some embodiments, the number of cycles may change over time during an etch integrated process.

In some embodiments, the carrier gas may only be flowed during the etch cycles and not the deposition cycles. In some embodiments, the carrier gas may only be flowed during deposition cycles and not the etch cycles. In some embodiments, carrier gases may vary between etch and deposition cycles.

In various embodiments, process conditions, such as pedestal temperature, chamber temperature, chamber pressure, gas flow rates, gas flow chemistry, duration of pulses, exposures, and purges, plasma frequency, plasma power, and bias power, may be adjusted depending on the type of application and the type of apparatus or tool upon which the disclosed embodiments are implemented.

Methods described herein may be suitable for various applications. Examples of applications include: (1) high aspect ratio sidewall or mask protection, (2) MRAM (magnetoresistive random access memory) etching and encapsulation processes, and (3) selectivity improvement during directional etch processes.

In some semiconductor processes, soft materials, such as amorphous silicon or germanium, are directionally etched to form trenches or holes, or substrates with layers having such features in it may be exposed to directional etching. However, some neutral species may form in the trench or feature which may etch sidewalls of the features. An ALE process in small features in particular may cause sidewalls to be susceptible to lateral etching that may elongate the features. Methods described herein by integrating ALE and ALD processes, the film deposited during ALD may protect the sidewalls of these features from being etched during ALE. Likewise, these ALE and ALD integrated processes may be used to reduce corner faceting in masks, improve rigidity of a mask, and prevent degradation of a mask.

Conventional MRAM etching and encapsulation processes often involve exposing a moisture-sensitive layer, thereby risking contamination of the device. Although encapsulation is used in MRAM fabrication, encapsulation as described herein may also be used for other device fabrication and may be used for other sensitive layers.

In MRAM etching, an MRAM stack may include a tantalum mask deposited on an MTJ (magnetic tunnel junction), which is further deposited on a cobalt and/or tantalum layer, and a substrate. In some embodiments, there are more layers deposited between these layers. An MTJ may include two cobalt iron boron (CoFeB) layers, with a magnesium oxide (MgO) layer sandwiched between the two CoFeB layers.

This stack may be etched by first etching the ruthenium layer. In some embodiments, the tantalum layer may be etched by ALE. Subsequently, an argon or helium plasma may be used to etch and open the MTJ, thereby exposing a moisture-sensitive layer. Methods described herein allow the substrate to remain in the same chamber while ALD is then performed to deposit a thin encapsulation film over the moisture-sensitive layer and encapsulate it. In some embodiments, this thin encapsulation film is an oxide or nitride layer. In various embodiments, the cobalt and/or tantalum layer below may then be etched to break through to the substrate to continue etching the layer below.

Methods described herein may also be suitable for improving selectivity in etch processes. For example, in some embodiments, conformal layer deposition may be performed to deposit thicker layers on some surfaces of the substrate. In some embodiments, selective ALD may be performed to deposit a thin film on some areas and not on others, such that subsequent ALE processes etch the exposed areas more than the ALD-deposited areas. For example, ALD may be performed to deposit on edges of features to prevent them from faceting during ALE.

Apparatus

Inductively coupled plasma (ICP) reactors which, in certain embodiments, may be suitable for atomic layer etching (ALE) operations and atomic layer deposition (ALD) operations are now described. Such ICP reactors have also described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 2:
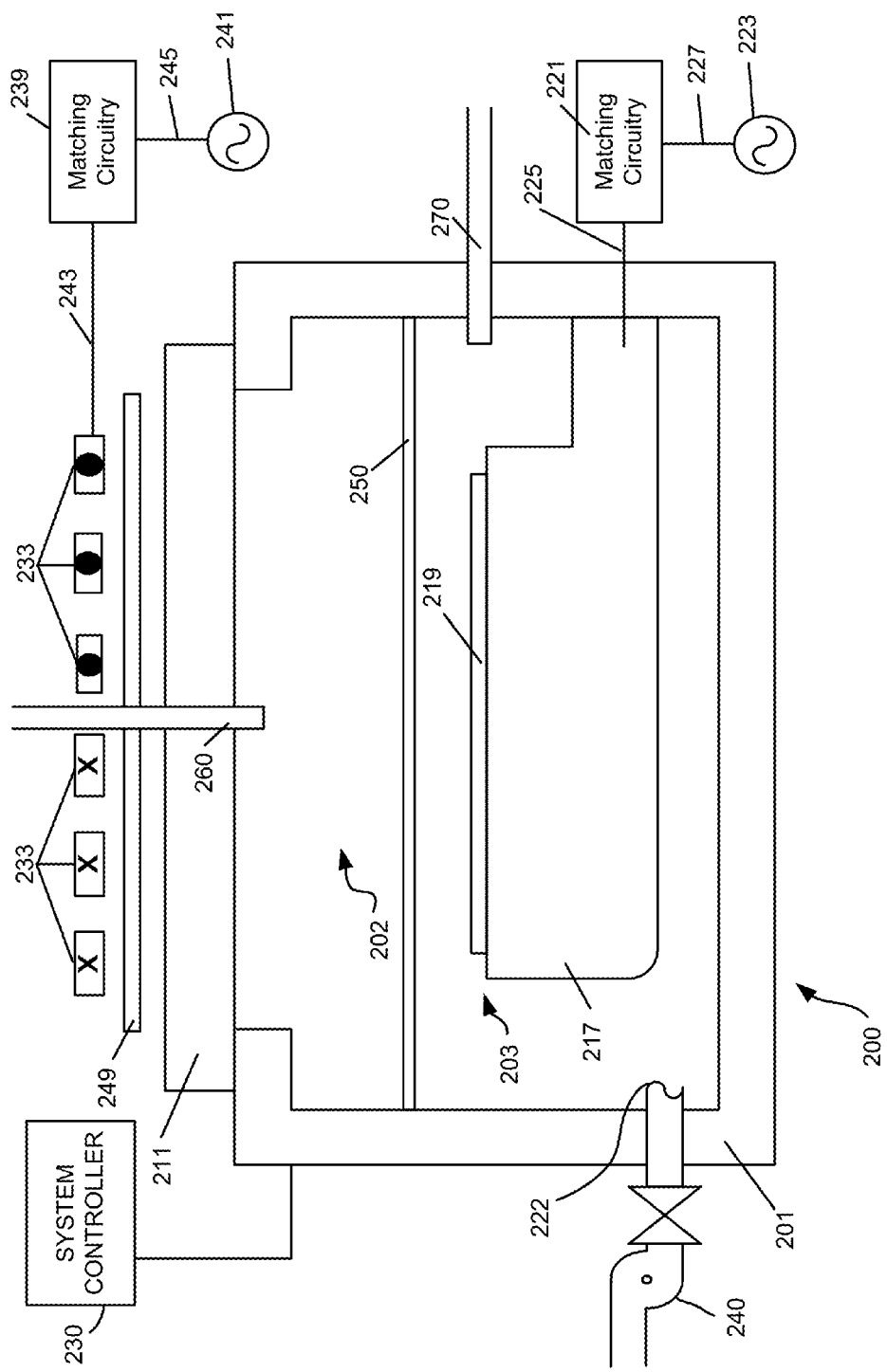
FIG. 2 is a schematic diagram of an example process chamber for performing disclosed embodiments.

FIG. 2 schematically shows a cross-sectional view of an inductively coupled plasma integrated etching and deposition apparatus 200 appropriate for implementing certain embodiments herein, an example of which is a Kiyo™ reactor, produced by Lam Research Corp. of Fremont, Calif. The inductively coupled plasma apparatus 200 includes an overall process chamber 201 structurally defined by chamber walls 201 and a window 211. The chamber walls 201 may be fabricated from stainless steel or aluminum. The window 211 may be fabricated from quartz or other dielectric material. An optional internal plasma grid 250 divides the overall processing chamber 201 into an upper sub-chamber 202 and a lower sub-chamber 203. In most embodiments, plasma grid 250 may be removed, thereby utilizing a chamber space made of sub-chambers 202 and 203. A chuck 217 is positioned within the lower sub-chamber 203 near the bottom inner surface. The chuck 217 is configured to receive and hold a semiconductor wafer 219 upon which the etching and deposition processes are performed. The chuck 217 can be an electrostatic chuck for supporting the wafer 219 when present. In some embodiments, an edge ring (not shown) surrounds chuck 217, and has an upper surface that is approximately planar with a top surface of a wafer 219, when present over chuck 217. The chuck 217 also includes electrostatic electrodes for chucking and dechucking the wafer. A filter and DC clamp power supply (not shown) may be provided for this purpose. Other control systems for lifting the wafer 219 off the chuck 217 can also be provided. The chuck 217 can be electrically charged using an RF power supply 223. The RF power supply 223 is connected to matching circuitry 221 through a connection 227. The matching circuitry 221 is connected to the chuck 217 through a connection 225. In this manner, the RF power supply 223 is connected to the chuck 217.

Elements for plasma generation include a coil 233 is positioned above window 211. In some embodiments, a coil is not used in disclosed embodiments. The coil 233 is fabricated from an electrically conductive material and includes at least one complete turn. The example of a coil 233 shown in FIG. 2 includes three turns. The cross-sections of coil 233 are shown with symbols, and coils having an "X" extend rotationally into the page, while coils having a "●" extend rotationally out of the page. Elements for plasma generation also include an RF power supply 241 configured to supply RF power to the coil 233. In general, the RF power supply 241 is connected to matching circuitry 239 through a connection 245. The matching circuitry 239 is connected to the coil 233 through a connection 243. In this manner, the RF power supply 241 is connected to the coil 233. An optional Faraday shield 249 is positioned between the coil 233 and the window 211. The Faraday shield 249 is maintained in a spaced apart relationship relative to the coil 233. The Faraday shield 249 is disposed immediately above the window 211. The coil 233, the Faraday shield 249, and the window 211 are each configured to be substantially parallel to one another. The Faraday shield may prevent metal or other species from depositing on the dielectric window of the plasma chamber 201.

Process gases (e.g. chlorine, argon, silicon tetrachloride, oxygen, nitrogen, etc.) may be flowed into the processing chamber 201 through one or more main gas flow inlets 260 positioned in the upper chamber 202 and/or through one or more side gas flow inlets 270. Likewise, though not explicitly shown, similar gas flow inlets may be used to supply process gases to a capacitively coupled plasma processing chamber. A vacuum pump, e.g., a one or two stage mechanical dry pump and/or turbomolecular pump 240, may be used to draw process gases out of the process chamber 201 and to maintain a pressure within the process chamber 201. For example, the pump may be used to evacuate the chamber 201 during a purge operation of ALD. A valve-controlled conduit may be used to fluidically connect the vacuum pump to the processing chamber 201 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 260 and/or 270. In certain embodiments, process gas may be supplied only through the main gas flow inlet 260, or only through the side gas flow inlet 270. In some cases, the gas flow inlets shown in the figure may be replaced more complex gas flow inlets, one or more showerheads, for example. The Faraday shield 249 and/or optional grid 250 may include internal channels and holes that allow delivery of process gases to the chamber 201. Either or both of Faraday shield 249 and optional grid 250 may serve as a showerhead for delivery of process gases. In some embodiments, a liquid vaporization and delivery system may be situated upstream of the chamber 201, such that once a liquid reactant or precursor is vaporized, the vaporized reactant or precursor is introduced into the chamber 201 via a gas flow inlet 260 and/or 270. Example liquid precursors include $SiCl_4$ and silicon amides.

Radio frequency power is supplied from the RF power supply 241 to the coil 233 to cause an RF current to flow through the coil 233. The RF current flowing through the coil 233 generates an electromagnetic field about the coil 233. The electromagnetic field generates an inductive current within the upper sub-chamber 202. The physical and chemical interactions of various generated ions and radicals with the wafer 219 selectively etch features of and deposit layers on the wafer.

If the plasma grid is used such that there is both an upper sub-chamber 202 and a lower sub-chamber 203, the inductive current acts on the gas present in the upper sub-chamber 202 to generate an electron-ion plasma in the upper sub-chamber 202. The optional internal plasma grid 250 limits the amount of hot electrons in the lower sub-chamber 203. In some embodiments, the apparatus is designed and operated such that the plasma present in the lower sub-chamber 203 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower-sub-chamber 203 through port 222. The chuck 217 disclosed herein may operate at elevated temperatures ranging between about 10° C. and about 250° C. The temperature will depend on the process operation and specific recipe.

Chamber 201 may be coupled to facilities (not shown) when installed in a clean room or a fabrication facility. Facilities include plumbing that provide processing gases, vacuum, temperature control, and environmental particle control. These facilities are coupled to chamber 201, when installed in the target fabrication facility. Additionally, chamber 201 may be coupled to a transfer chamber that allows robotics to transfer semiconductor wafers into and out of chamber 201 using typical automation.

In some embodiments, a system controller 230 (which may include one or more physical or logical controllers) controls some or all of the operations of a processing chamber. The system controller 230 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, a controller 230 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 230, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 230 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 230, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 230 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 230 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 3:
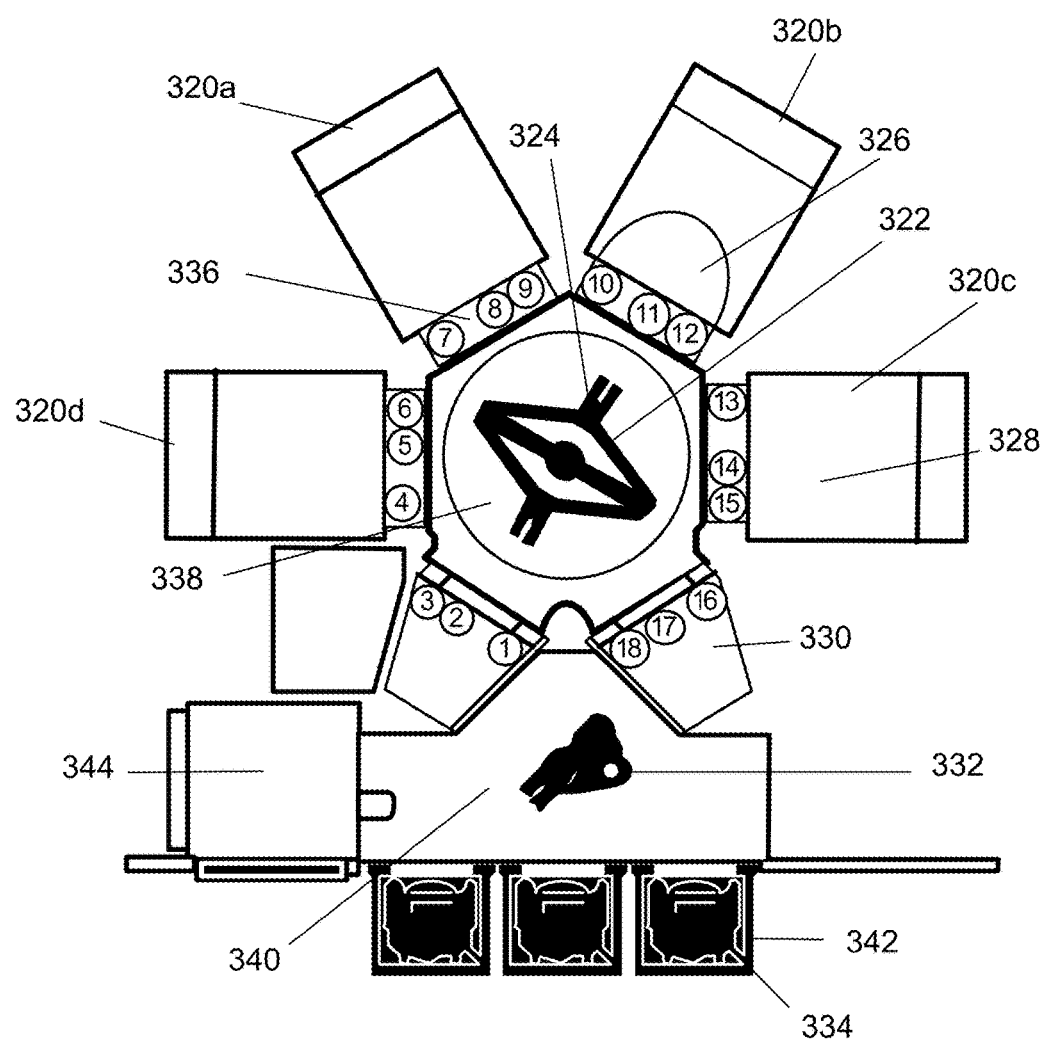
FIG. 3 is a schematic diagram of an example process apparatus for performing disclosed embodiments.

FIG. 3 depicts a semiconductor process cluster architecture with various modules that interface with a vacuum transfer module 338 (VTM). The arrangement of transfer modules to "transfer" wafers among multiple storage facilities and processing modules may be referred to as a "cluster tool architecture" system. Airlock 330, also known as a loadlock or transfer module, is shown in VTM 338 with four processing modules 320a-320d, which may be individual optimized to perform various fabrication processes. By way of example, processing modules 320a-320d may be implemented to perform substrate etching, deposition, ion implantation, wafer cleaning, sputtering, and/or other semiconductor processes. In some embodiments, ALD and ALE are performed in the same module. In some embodiments, ALD and ALE are performed in different modules of the same tool. One or more of the substrate etching processing modules (any of 320a-320d) may be implemented as disclosed herein, i.e., for depositing conformal films, selectively depositing films by ALD, etching patterns, and other suitable functions in accordance with the disclosed embodiments. Airlock 330 and process module 320 may be referred to as "stations." Each station has a facet 336 that interfaces the station to VTM 338. Inside each facet, sensors 1-18 are used to detect the passing of wafer 326 when moved between respective stations.

Robot 322 transfers wafer 326 between stations. In one embodiment, robot 322 has one arm, and in another embodiment, robot 322 has two arms, where each arm has an end effector 324 to pick wafers such as wafer 326 for transport. Front-end robot 332, in atmospheric transfer module (ATM) 340, is used to transfer wafers 326 from cassette or Front Opening Unified Pod (FOUP) 334 in Load Port Module (LPM) 342 to airlock 330. Module center 328 inside process module 320 is one location for placing wafer 326. Aligner 344 in ATM 340 is used to align wafers.

In an exemplary processing method, a wafer is placed in one of the FOUPs 334 in the LPM 342. Front-end robot 332 transfers the wafer from the FOUP 334 to an aligner 344, which allows the wafer 326 to be properly centered before it is etched or processed. After being aligned, the wafer 326 is moved by the front-end robot 332 into an airlock 330. Because airlock modules have the ability to match the environment between an ATM and a VTM, the wafer 326 is able to move between the two pressure environments without being damaged. From the airlock module 330, the wafer 326 is moved by robot 322 through VTM 338 and into one of the process modules 320a-320d. In order to achieve this wafer movement, the robot 322 uses end effectors 324 on each of its arms. Once the wafer 326 has been processed, it is moved by robot 322 from the process modules 320a-320d to an airlock module 330. From here, the wafer 326 may be moved by the front-end robot 332 to one of the FOUPs 334 or to the aligner 344.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 2 may be implemented with the tool in FIG. 3.

EXPERIMENTAL

Experiment 1

An experiment was conducted in accordance with disclosed embodiments. An amorphous silicon substrate was provided. The substrate also included a patterned mask. The substrate was provided into a Kiyo™ reactor available from Lam Research Corp., of Fremont, Calif. The substrate was exposed to 50 cycles of ALE to etch features. After the cycles of ALE, the substrate was then exposed to 50 cycles of ALD to generate 5 nm of $SiO_2$ using $SiCl_4$ as a precursor and $O_2$ plasma as a second reactant in the same Kiyo reactor without breaking vacuum. Note that 5 nm of $SiO_2$ was deposited to visibly show a result in the image of the substrate.

Figure 4:
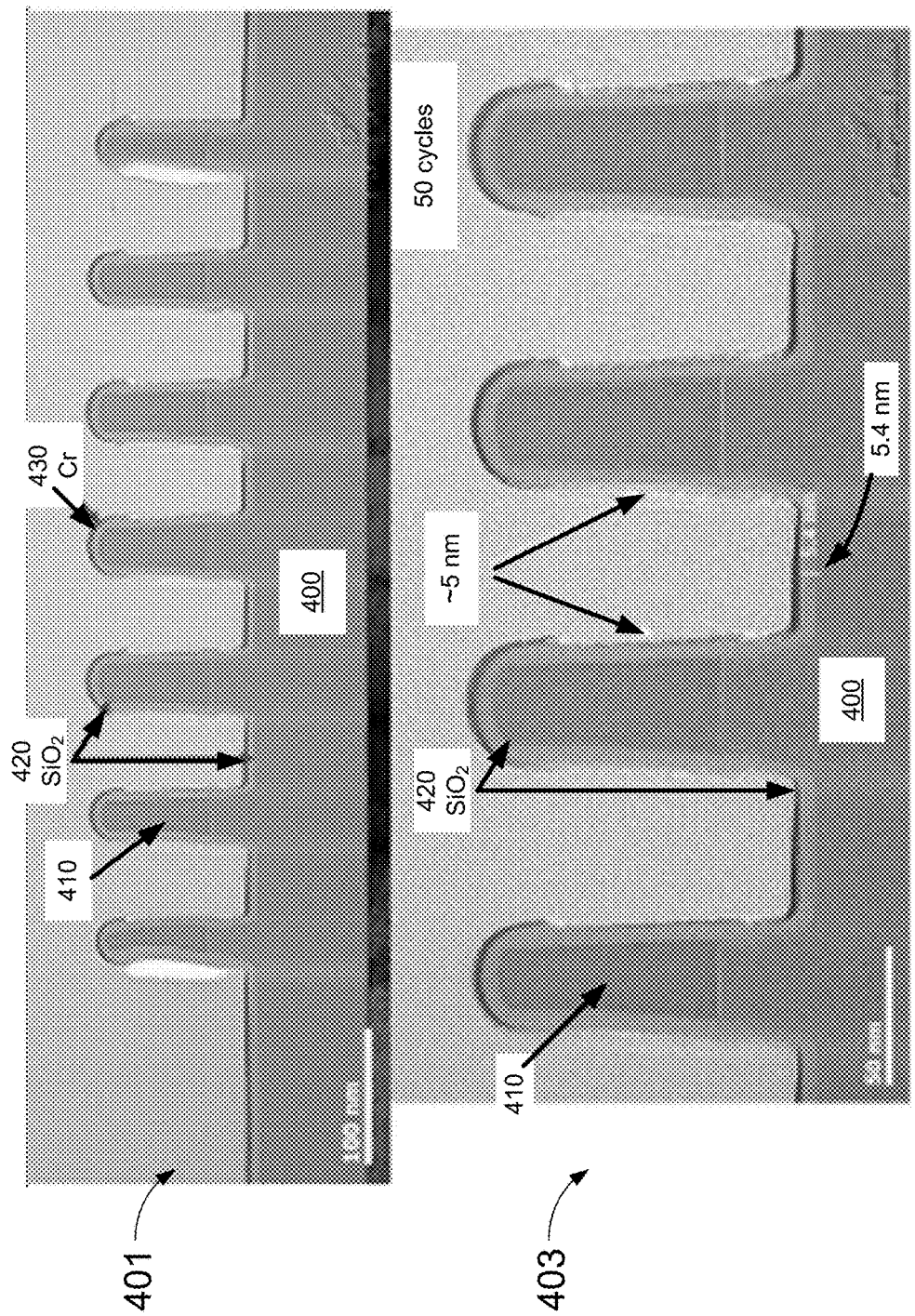
FIG. 4 shows images of an etched substrate from an experiment conducted in accordance with disclosed embodiments.

The resulting etched features in the substrate 400 are depicted in FIG. 4. Image 401 shows the etched substrate with the patterned mask 410, with a conformal blanket layer of $SiO_2$ 420 deposited over the patterned mask 410. Note that in the image shown, a capping layer of chromium 430 is shown. Image 403 shows an enlarged image of the same features in image 401. As shown in image 403, the $SiO_2$ 420 deposited by ALD is conformal with about 5 nm on the sidewalls, and about 5.4 nm deposited at the bottom of the features. The results demonstrate the viability of an integrated ALE and ALD process in the same chamber.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a substrate, the method comprising:
   etching the substrate by atomic layer etch in a chamber; and
   depositing a film by atomic layer deposition,
   wherein the etching and the depositing are performed without breaking vacuum.

2. The method of claim 1, wherein the etching is performed in cycles, a cycle comprising
   exposing the substrate to an etching gas to modify the surface of the substrate; and
   exposing the substrate to a removal gas to remove at least some of the modified surface.

3. The method of claim 2, wherein exposing the substrate to the etching gas further comprises igniting a plasma.

4. The method of claim 3, wherein the chamber is purged between exposing the substrate to the etching gas and exposing the substrate to the removal gas.

5. The method of claim 2, further comprising applying a bias to the substrate.

6. The method of claim 1, wherein the depositing is performed in cycles, a cycle comprising
   exposing the substrate to a deposition precursor to modify the surface of the substrate; and
   exposing the substrate to a reducing agent to deposit the film.

7. The method of claim 6, further comprising igniting a plasma.

8. The method of claim 1, wherein the etching and the depositing are performed to deposit material on the substrate.

9. The method of claim 1, wherein the etching and the depositing are performed to etch material on the substrate.

10. The method of claim 1, wherein the etching further comprises directionally sputtering the substrate.

11. The method of claim 1, wherein the etching and the depositing is performed in the same chamber.

12. The method of claim 1, wherein the etching is performed nonconformally.

13. The method of claim 1, wherein at least one of the etching or the depositing is a self-limiting reaction.

14. A method comprising:
   (a) exposing a substrate housed in a chamber to alternating pulses of an etching gas and a removal gas to etch the substrate layer by layer, wherein a plasma is ignited during at least one of a pulse of the etching gas and a pulse of the removal gas; and
   (b) exposing the substrate to alternating pulses of a first reactant and a second reactant to deposit a film over the substrate.

15. The method of claim 14, wherein the removal gas is a carrier gas selected from the group consisting of $N_2$, Ar, He, and Ne.

16. The method of claim 14, wherein (a) and (b) are performed in the same chamber and are performed sequentially.

17. The method of claim 14, wherein (a) further comprises applying a bias to the substrate.

18. The method of claim 14, wherein at least one of (a) or (b) is a self-limiting reaction.

19. The method of claim 14, wherein (a) and (b) are repeated to deposit material on the substrate.

20. The method of claim 14, wherein (a) and (b) are repeated to etch a film on the substrate.

21. The method of claim 14, wherein (a) and (b) are performed without breaking vacuum.

22. The method of claim 14, wherein (a) and (b) are performed in the same chamber.

23. The method of claim 14, wherein the plasma is ignited during the pulse of the removal gas.

24. The method of claim 14, wherein the chamber is purged between the alternating pulses of the etching gas and the removal gas.

25. A method of processing a substrate, the method comprising:

etching the substrate by atomic layer etch in a chamber; and depositing a film by atomic layer deposition, wherein the etching and the depositing are performed without breaking vacuum, and wherein a plasma is ignited during at least one of the etching and the depositing.

26. The method of claim 25, wherein the etching is performed in cycles, a cycle comprising exposing the substrate to an etching gas to modify the surface of the substrate, and exposing the substrate to a removal gas to remove at least some of the modified surface;

wherein the plasma is ignited during the exposing the substrate to the removal gas; and wherein the chamber is purged between exposing the substrate to the etching gas and exposing the substrate to the removal gas.

* * * * *